(12) United States Patent
Lee

(10) Patent No.: US 7,843,763 B2
(45) Date of Patent: Nov. 30, 2010

(54) SEMICONDUCTOR MEMORY DEVICE AND DATA MASKING METHOD OF THE SAME

(75) Inventor: Sang Hee Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 230 days.

(21) Appl. No.: 12/137,699

(22) Filed: Jun. 12, 2008

(65) Prior Publication Data
US 2009/0161445 A1    Jun. 25, 2009

(30) Foreign Application Priority Data
Dec. 21, 2007    (KR) ...................... 10-2007-0135584

(51) Int. Cl.
*G11C 8/00*    (2006.01)
(52) U.S. Cl. ................ 365/233.1; 365/194; 365/233.11
(58) Field of Classification Search ................ 365/194, 365/233.1, 233.11
See application file for complete search history.

(56) References Cited

U.S. PATENT DOCUMENTS

| | | | |
|---|---|---|---|
| 6,744,678 B2 * | 6/2004 | Yoo | 365/191 |
| 7,038,953 B2 * | 5/2006 | Aoki | 365/189.05 |
| 7,573,757 B2 * | 8/2009 | Ha et al. | 365/189.15 |
| 2009/0207676 A1 * | 8/2009 | Park | 365/191 |

FOREIGN PATENT DOCUMENTS

KR    1020060101334 A    9/2006

* cited by examiner

*Primary Examiner*—Anh Phung
*Assistant Examiner*—Hien N Nguyen
(74) *Attorney, Agent, or Firm*—Ladas & Parry LLP

(57) ABSTRACT

A semiconductor memory device has a data masking function during a write operation. The semiconductor memory device includes a data mask input unit that receives a data mask signal. A data input unit receives data and delays the output of the data more than the output of the data mask signal. A write driver selectively drives the data outputted from the data input unit according to the data mask signal outputted from the data mask input unit. The semiconductor memory device ensures that the data mask signal is inputted into the write driver prior to the input of the data, thus preventing a timing mismatch between data and the data masking signal and poor data masking.

14 Claims, 6 Drawing Sheets

SEMICONDUCTOR MEMORY DEVICE AND DATA MASKING METHOD OF THE SAME

CROSS-REFERENCE TO RELATED APPLICATIONS

The present application claims priority to Korean patent application number 10-2007-0135584 filed on Dec. 21, 2007, which is incorporated herein by reference in its entirety.

BACKGROUND OF THE INVENTION

The present invention relates to a semiconductor memory device, and more particularly to a semiconductor memory device having a data masking function in a write operation and a data masking method of the same.

A semiconductor memory device typically provides a data mask function, where the operation of a write driver is controlled using an externally input data mask signal for masking data in a write operation.

When data is inputted from outside the semiconductor memory device, the data passes through a data input path and is then transferred to the write driver via a global input/output line. The data mask signal passes through a data mask input path which is identical to the path of the data input path, and is then transferred to the write driver via a global input/output line.

The data and the data mask signal inputted into the write driver race to the write driver, i.e., the time at which the write driver receives the data and the data mask signal determines whether the data is masked or not.

However, even though the data input path and the data mask input path are identical, it is possible that the data and data mask signal will not inputted into the write driver at the same time as intended, which is caused by, for example, certain processes or a change in the external environment.

Consequently, if the data mask signal is inputted into the write driver prior to the input of the data, data that should have been protected may in fact not be protected, thereby resulting in a poor data mask function.

SUMMARY OF THE INVENTION

There is provided a semiconductor memory device which can prevent poor data masking caused by a timing mismatch between data and a data masking signal, and a data masking method of the same.

According to a first embodiment of the present invention, there is provided a semiconductor memory device, which includes: a data mask input unit transferring a data mask signal; a data input unit transferring data, wherein the data input unit delays the transfer of data, such that the data outputted from the data input unit is delayed more than the data mask signal outputted from the data mask input unit; and a write driver selectively driving the data outputted from the data input unit according to the data mask signal outputted from the data mask input unit.

Preferably, the data mask input unit outputs the data mask signal to the write driver synchronously with a first internal clock and the data input unit outputs the data to the write driver synchronously with a second internal clock which is delayed more than the first internal clock.

According to a second embodiment of the present invention, there is provided a semiconductor memory device, which includes: an internal clock generating unit generating a first internal clock and a second internal clock which is delayed more than the first internal clock; a data input unit aligning sequentially inputted data in parallel and outputting the aligned data to a first global input/output line synchronously with the second internal clock; a data mask input unit aligning sequentially inputted data mask signals in parallel and outputting the aligned data mask signals to a second global input/output line synchronously with the first internal clock; and a write driver selectively driving the data outputted to the first global input/output line according to the data mask signals outputted to the second global input/output line.

Preferably, the internal clock generating unit includes a buffering unit buffering an external clock and outputting the buffered external clock as the first internal clock; and a delaying unit delaying the first internal clock and outputting the delayed first internal clock as the second internal clock.

According to a third embodiment of the present invention, there is provided a semiconductor memory device, which includes: an internal clock generating unit generating a first internal clock and a second internal clock delayed more than the first internal clock; a data input/output sense amplifying unit receiving data and the second internal clock, and sensing and amplifying the data synchronously with the second internal clock to output the amplified data to a first global input/output line; a data mask input/output sense amplifying unit receiving data mask signal and the first internal clock, and sensing and amplifying the data mask signal synchronously with the first internal clock to output the amplified data mask signal to a second global input/output line; and a write driver selectively driving the data outputted to the first global input/output line according to the data mask signal outputted to the second global input/output line.

Preferably, the internal clock generating unit includes a buffering unit buffering an external clock and outputting the buffered external clock as the first internal clock; and a delaying unit delaying the first internal clock and outputting the delayed first internal clock as the second internal clock.

According to a fourth embodiment of the present invention, there is provided a semiconductor memory device, which includes: an internal clock generating unit generating a first internal clock and a second internal clock delayed more than the first internal clock; a data strobe buffering unit buffering a data strobe signal to output the buffered data strobe signal as a data strobe rising pulse and a data strobe falling pulse; a data input unit receiving the first internal clock, the data strobe rising and falling pulses, and a write flag signal to control sequentially inputted data and outputting the controlled data to a first global input/output line; a data mask input unit receiving the second internal clock, the data strobe rising and falling pulses, and the write flag signal to control sequentially inputted data mask signals and outputting the controlled data mask signals to a second global input/output line; and a write driver selectively driving the data outputted to the first global input/output line according to the data mask signals outputted to the second global input/output line.

Preferably, the internal clock generating unit includes a buffering unit buffering an external clock and outputting the buffered external clock as the first internal clock; and a delaying unit delaying the first internal clock and outputting the delayed first internal clock as the second internal clock.

Preferably, the data input unit includes a data buffering unit buffering the sequentially inputted data; a data latch/alignment unit receiving the data buffered in the data buffering unit and the data strobe rising and falling pulses, and latching and aligning the data in parallel synchronously with the data strobe rising and falling pulses; a data input strobe generating unit receiving the first internal clock and the write flag signal to generate a data input strobe pulse; and a data input/output sense amplifying unit sensing and amplifying the data latched and aligned in the data latch/alignment unit synchronously with the data input strobe pulse to output the amplified data to the first global input/output line.

Preferably, the data input unit further includes a multiplexer connected between the data latch/alignment unit and the data input/output sense amplifying unit, and the multiplexer selects a paths through which the latched and aligned data is outputted to the data latch/alignment unit, and the paths are selected according to a data input/output mode.

Preferably, the amount of delay that the internal clock generating unit delays the first internal clock is equal to or greater than the delay caused by the multiplexer to output the second internal clock.

Preferably, the data mask input unit includes a data mask buffering unit buffering the sequentially inputted data mask signals; a data mask latch/alignment unit receiving the data mask signals buffered in the data mask buffering unit and the data strobe rising and falling pulses, and latching and aligning the data mask signals in parallel synchronously with the data strobe rising and falling pulses; a data mask input strobe generating unit receiving the second internal clock and the write flag signal to generate a data mask input strobe pulse; and a data mask input/output sense amplifying unit sensing and amplifying the data mask signal latched and aligned in the data latch/alignment unit synchronously with the data mask input strobe pulse to output the amplified data mask signals to the second global input/output line.

According to a fifth embodiment of the present invention, there is provided a data masking method of a semiconductor memory device, which includes: a mask signal transferring step transferring a data mask signal inputted from outside the semiconductor memory device to an internal circuit; a data transferring step delaying data inputted from outside the semiconductor memory device more than the data mask signal and transferring the delayed data to the internal circuit; and a data masking step masking the data transferred to the internal circuit with the data mask signal transferred to the internal circuit.

Preferably, in the mask signal transferring step, the data mask signal is transferred to the internal circuit synchronously with a first internal clock; and in the data transferring step, the data is transferred to the internal circuit synchronously with a second internal clock is delayed more than the first internal clock.

DESCRIPTION OF SPECIFIC EMBODIMENTS

Hereinafter, preferred embodiments of the present invention will be described in detail with reference to the accompanying drawings.

The present invention discloses a semiconductor memory device which ensures that a data mask signal is transferred to a write driver prior to data reaching the write driver to prevent poor data masking; and a data masking method of the same.

Figure 1:
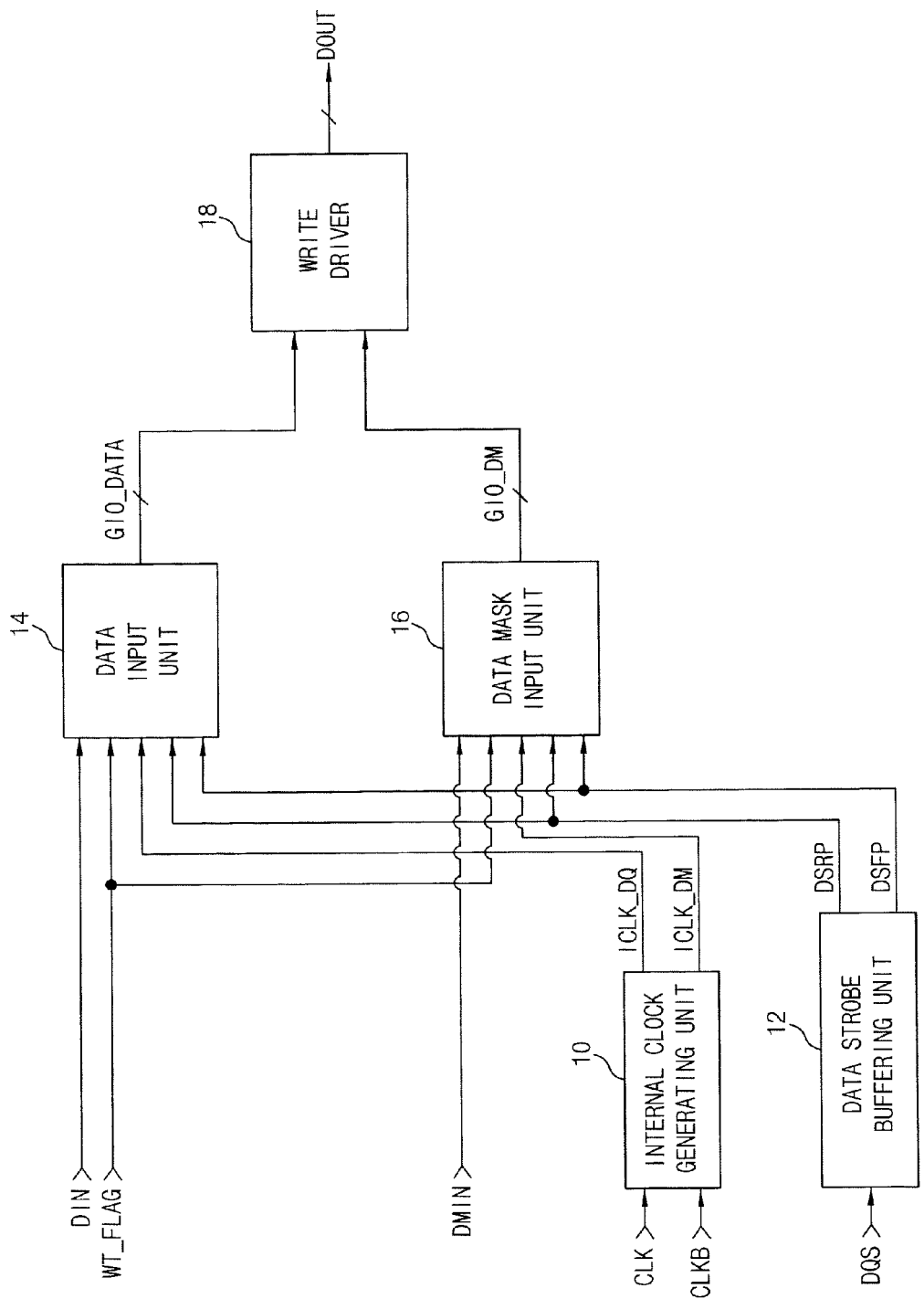
FIG. 1 is a block diagram showing a portion of the write path of a semiconductor memory device according to an embodiment of the present invention.

FIG. 1 is a block diagram showing a portion of the write path of a semiconductor memory device according to an embodiment of the present invention.

Referring to FIG. 1, the semiconductor memory device includes a data input unit 14, a data mask input unit 16, and a write driver 18.

The data input unit 14 and the data mask input unit 16 transfer data DIN and a data mask signal DMIN, which are each inputted from outside the semiconductor memory device, to the write driver 18, respectively. The transfer of data DIN is delayed more than the transfer of data mask signal DMIN using an internal clock generating unit 10 (described in more detail below).

The write driver 18 is controlled by the data mask signal GIO_DM (which is transferred from the data mask input unit 16) to selectively drives data GIO_DATA transferred from the data input unit 14, and outputs the data as output data DOUT.

The data input unit 14 and the data mask input unit 16 are controlled by internal clocks ICLK_DQ and ICLK_DM and the data strobe rising pulse DSRP and data strobe falling pulse DSFP when transferring the data DIN and the data mask signal DMIN, respectively. The internal clocks ICLK_DQ and ICLK_DM are outputted from the internal clock generating unit 10, and the data strobe rising pulse DSRP and data strobe falling pulse DSFP are outputted from a data strobe buffering unit 12.

The internal clock generating unit 10 receives an external clock CLK and an inverted external clock CLKB (which is formed by an inversion of the external clock CLK) and then generates the internal clock ICLK_DQ and the internal clock ICLK_DM which is delayed more than the internal clock ICLK_DQ by the internal clock generating unit 10.

The data strobe buffering unit 12 buffers a data strobe signal DQS to generate the data strobe rising pulse DSRP and the data strobe falling pulse DSFP.

Figure 2:
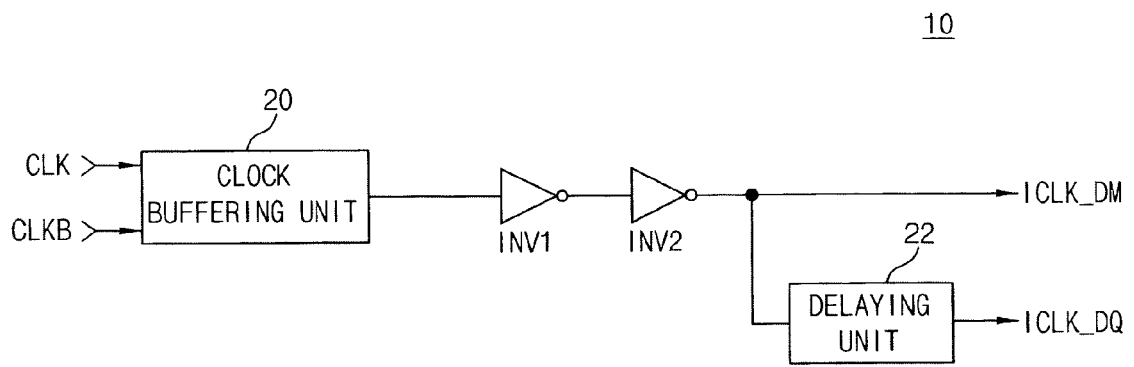
FIG. 2 is a circuit diagram showing an example detailed configuration of the internal clock generating unit of FIG. 1.

FIG. 2 is a circuit diagram showing an example detailed configuration of the internal clock generating unit 10.

Referring to FIG. 2, the internal clock generating unit 10 includes: a clock buffering unit 20, which buffers the external clock CLK and the inverted external clock CLKB to output the internal clock ICLK_DM; and a delaying unit 22, which delays the internal clock ICLK_DM to output the delayed internal clock as the internal clock ICLK_DQ. The delay unit 22 preferably delays the internal clock ICLK_DM by the same amount or an amount larger than the amount of delay caused by a multiplexer 34 included in the data input unit 14 (if the multiplexer 34 is necessary as is described in more detail below).

The internal clock generating unit 10 may also include two inverters INV1 and INV2 which delay or drive the output from the clock buffering unit 20.

The data input unit 14 and the data mask input unit 16 are controlled by the respective internal clocks ICLK_DQ and ICLK_DM outputted from the internal clock generating unit 10 and the data strobe rising pulse DSRP and the data strobe falling pulse DSFP outputted from the data strobe buffering unit 12.

Figure 3:
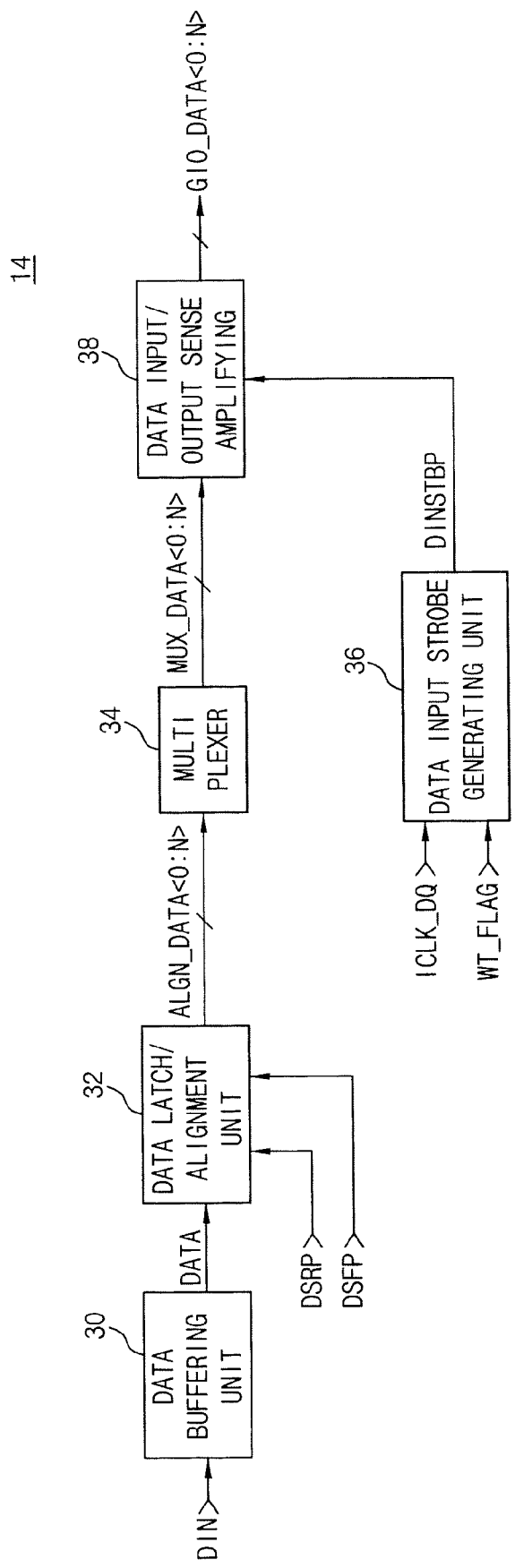
FIG. 3 is a block diagram showing an example detailed configuration of the data input unit of FIG. 1.

FIG. 3 is a block diagram showing an example detailed configuration of the data input unit 14 of FIG. 1.

Referring to FIG. 3, the data input unit 14 includes a data buffering unit 30, a data latch/alignment unit 32, a data input strobe generating unit 36, and a data input/output sense amplifying unit 38. The data input unit may also include a multiplexer 34 if various data input/output modes (for example, ×4, ×8, ×16) are supported.

The data buffering unit 30 buffers the data DIN inputted from the outside the semiconductor memory device to output the buffered data as internal data DATA.

The data latch/alignment unit 32 latches the internal data DATA and arranges the internal DATA in parallel such that the internal data DATA is synchronized with the data strobe rising pulse DSRP or the data strobe falling pulse DSFP. Then, the data latch/alignment unit 32 outputs aligned data ALIGN_DATA<0:N> (here, 'N' is an integer greater than 1).

The multiplexer 34 multiplexes the aligned data ALIGN_DATA<0:N> corresponding to data input/output modes to output multiplexed data MUX_DATA<0:N>. Here, the multiplexer 34 is necessary only when the semiconductor memory device supports various data input/output modes (e.g., ×4, ×8, ×16). For example, in ×16 mode, the operation of the multiplexer 34 is unnecessary since each data input circuit of the 16 data input circuits receive the data. However, in ×8 mode or ×4 mode, only 8 or 4 of the 16 data input circuits operate, and the inputted data should be moved through the corresponding data transfer line of data transfer lines when the inputted data are transferred to a data storage area (the data transfer lines are connected correspondingly to the 16 data input circuits).

The data input strobe generating unit 36 receives the internal clock ICLK_DQ and a write flag signal WT_FLAG (which is generated during a write command), and the data input strobe generating unit 36 generates a data input strobe pulse DINSTBP.

The data input/output sense amplifying unit 38 senses and amplifies the multiplexed data MUX_DATA<0:N> synchronously with the data input strobe pulse DINSTBP, and outputs the amplified data GIO_DATA<0:N> to a first global input/output line.

Figure 4:
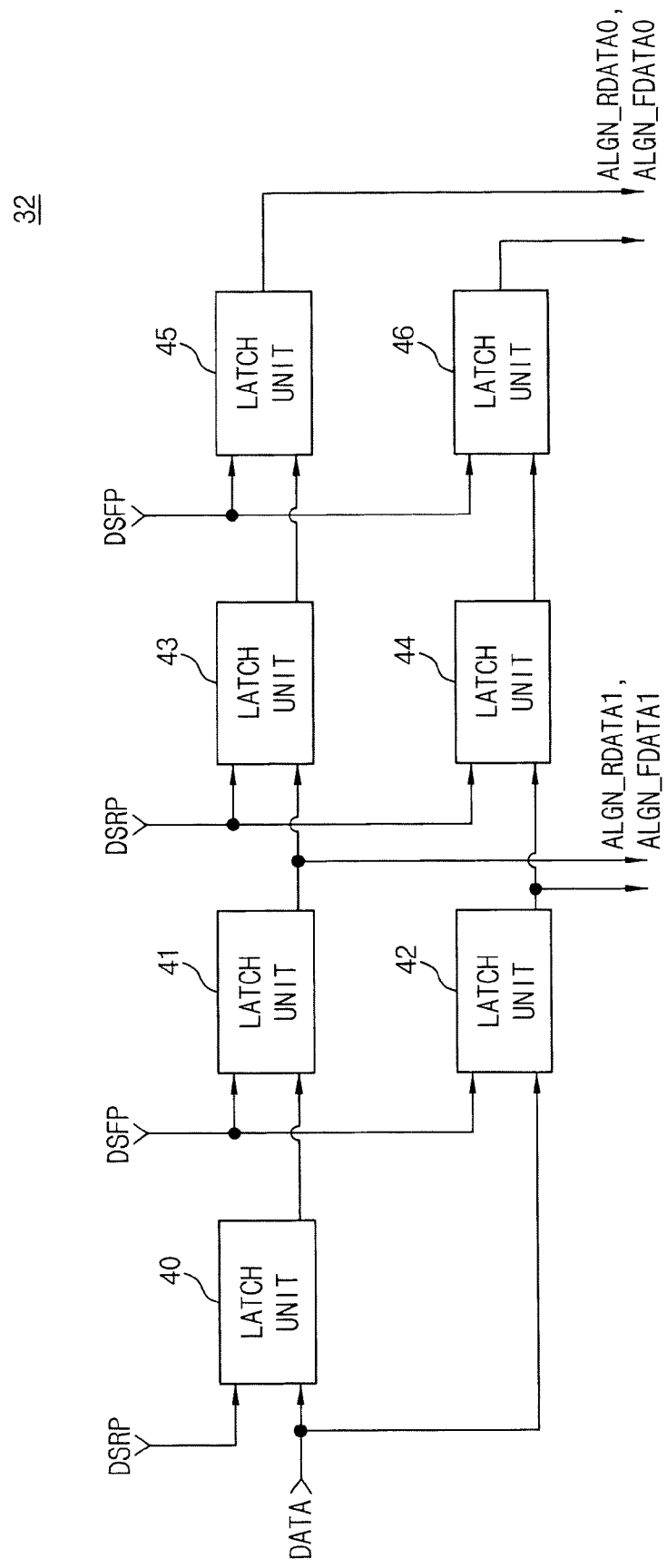
FIG. 4 is a block diagram showing an example detailed configuration of the data latch/alignment unit of FIG. 3 with a four-bit prefetch structure.

FIG. 4 is a block diagram showing an example detailed configuration of the data latch/alignment unit 32 if the semiconductor memory device according to an embodiment of the present invention is of a four-bit prefetch structure.

Referring to FIG. 4, the data latch/alignment unit 32 includes a plurality of latch units 40 to 46. Each latch unit latches either the data DATA or an output from the latch unit of a previous stage synchronously with the data strobe rising pulse DSRP or the data strobe falling pulse DSFP. Therethrough, the data latch/alignment unit 32 outputs aligned data ALGN_RDATA1, ALGN_FDATA1, ALGN_RDATA0, and ALGN_FDATA0.

The operation of the data input unit 14 including the data buffering unit 30, the data latch/alignment unit 32, the multiplexer 34, the data input strobe generating unit 36, and the data input/output sense amplifying unit 38 described above will now be described with respect to FIG. 5.

Figure 5:
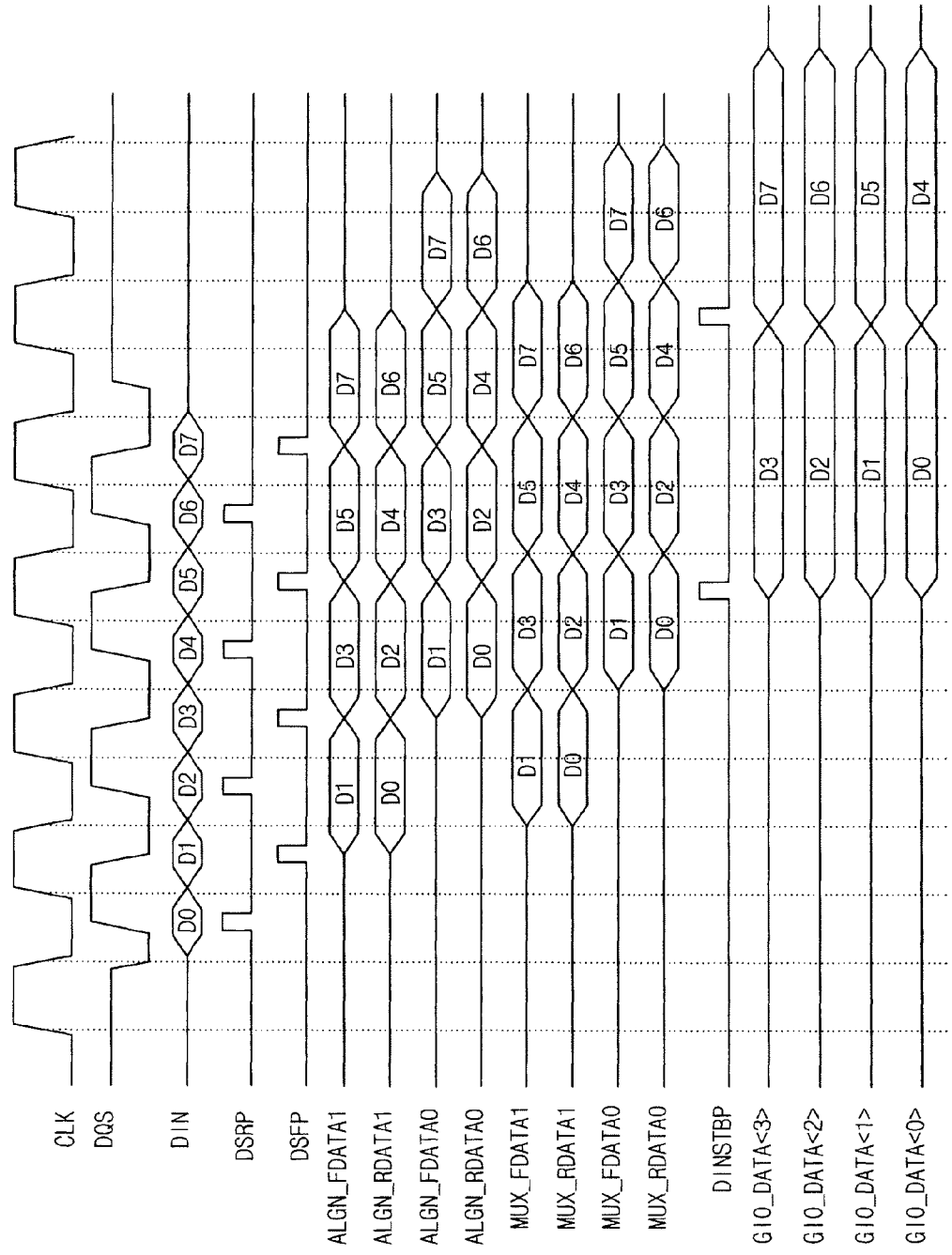
FIG. 5 is a waveform diagram shown for illustrating the write operation of the data input unit of FIG. 1.

Referring to FIG. 5, a data strobe signal DQS is inputted, and then the data strobe rising pulse DSRP (which is synchronized with a rising edge of the data strobe signal DQS) and the data strobe falling pulse DSFP (which is synchronized with a falling edge of the data strobe signal DQS) are generated by the data strobe buffering unit 12.

Then, data DIN (D<0:7>), which is sequentially inputted from the outside together with the data strobe signal DQS, is inputted into the data latch/alignment unit 32 and aligned using the data strobe rising pulse DSRP and the data strobe falling pulse DSFP. The data latch/alignment unit then outputs aligned data ALGN_RDATA1, ALGN_FDATA1, ALGN_RDATA0, and ALGN_FDATA0.

The aligned data ALGN_RDATA1, ALGN_FDATA1, ALGN_RDATA0, and ALGN_FDATA0 outputted from the data latch/alignment unit 32 is multiplexed via the multiplexer 34 to corresponding to the data input/output mode, and then the data is outputted as multiplexed data MUX_FDATA1, MUX_RDATA1, MUX_FDATA0, and MUX_RDATA0.

The multiplexed data MUX_FDATA1, MUX_RDATA1, MUX_FDATA0, and MUX_RDATA0 is amplified synchronously with the data input strobe signal DINSTBP generated by the data input strobe generating unit 36, and the amplified data GIO_DATA<0:3> is provided to the write driver 18 via the first global input/output line. The data input strobe signal DINSTBP is a signal generated on the basis of the internal clock ICLK_DQ, and therefore a crossover from the data strobe domain (DQS domain) to the clock domain occurs during the process. This is referred as write domain crossing.

Figure 6:
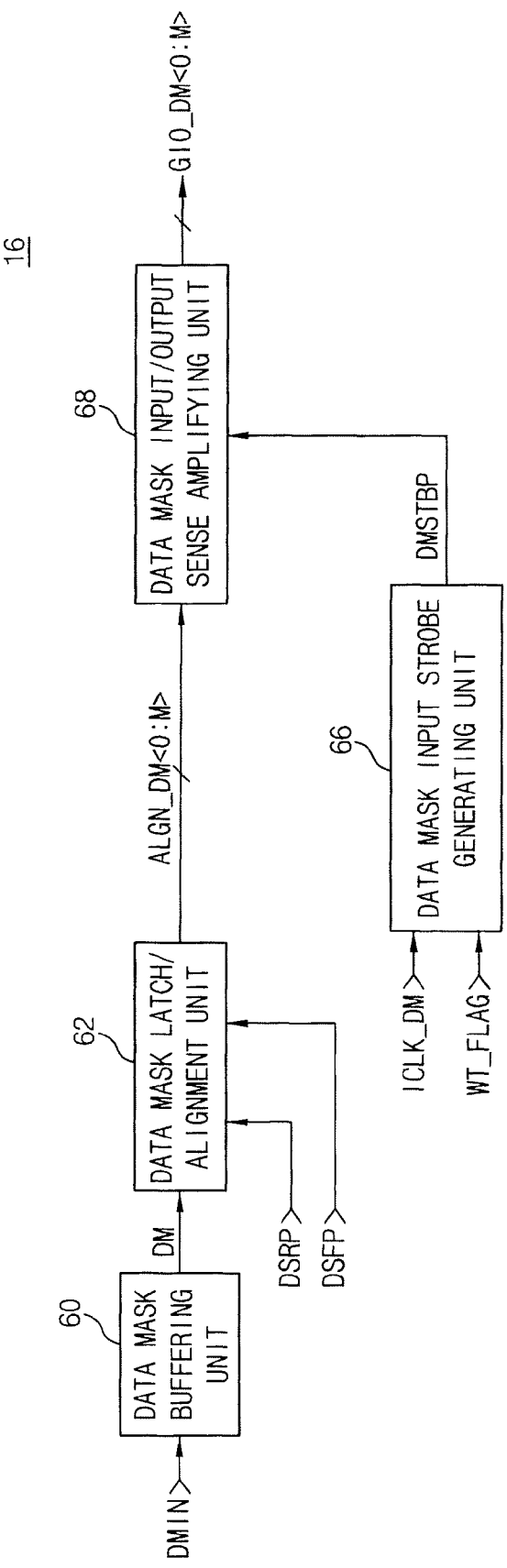
FIG. 6 is a block diagram showing an example detailed configuration of the data mask input unit of FIG. 1.

FIG. 6 is a block diagram showing an example of the data mask input unit 16 of FIG. 1.

Referring to FIG. 6, the data mask input unit 16 includes a data mask buffering unit 60, a data mask latch/alignment unit 62, a data mask input strobe generating unit 66, and a data mask input/output sense amplifying unit 68.

The data mask buffering unit 60 buffers the data mask signal inputted from outside the semiconductor memory device to output the buffered data mask signal as internal data mask signal DM. Preferably, the data mask buffering unit 60 is substantially identical in structure to the data buffering unit 30 of FIG. 3.

The data mask latch/alignment unit 62 latches the internal data mask signal DM and arranges the internal mask signal DM in parallel such that the internal data mask signal DM is synchronized with the data strobe rising pulse DSRP or the data strobe falling pulse DSFP. Then, the data latch/alignment unit 32 outputs aligned data mask signals ALGN_DM<0:M> (here, 'M' is an integer greater than 1). Preferably, the data mask latch/alignment unit 62 is substantially identical in structure to the data latch/alignment unit 32 of FIG. 3.

The data mask input strobe generating unit 66 receives the internal clock ICLK_DM and a write flag signal WT_FLAG (which is generated during a write command), and the data mask input strobe generating unit 66 generates a data mask input strobe pulse DMSTBP. Preferably, the data mask input strobe generating unit 66 is substantially identical in structure to the data input strobe generating unit 36 of FIG. 3.

The data mask input/output sense amplifying unit 68 senses and amplifies the aligned data mask signals ALGN_DM<0:M> synchronously with a data mask input strobe pulse DMSTBP, and outputs the amplified data GIO_DM<0:M> to a second global input/output line. Preferably, the data mask input/output sense amplifying unit 68 is substantially identical in structure to the data input/output sense amplifying unit 38 of FIG. 3.

As such, the data mask input unit 16 can be substantially identical in structure to the data input unit 14, except for the omission of the multiplexer 14. However, the internal clock ICLK_DQ provided to the data input strobe generating unit 36 is delayed by more than the internal clock ICLK_DM provided to the data mask input strobe generating unit 66, and therefore the data mask input strobe pulse DMSTBP, which is provided to the data mask input/output sense amplifying unit 68, is generated prior to the data input strobe pulse DINSTBP, which is provided to the data input/output sense amplifying unit 38.

Therefore, the data mask input/output sense amplifying unit 68 outputs the data mask signals GIO_DM<0:M> and transfers it to the second global input/output line prior to the data input/output sense amplifying unit 38, and therefore the data mask signals GIO_DM<0:M> are inputted into the write driver 18 prior to the data GIO_DATA<0:N>.

As described above, the semiconductor memory device according to an embodiment of the present invention has a structure in which the data mask signal is transferred to the write driver prior to the data.

As one example, the semiconductor memory device according to an embodiment of the present invention uses the internal clock, which is formed by buffering the external clock, in the write domain crossing of the data mask signal; and uses the clock delayed by more than the internal clock in the write domain crossing of the data.

As described above, the multiplexer 34 can be provided in the data input unit 14 (as is shown in FIG. 3) when the semiconductor memory device according to an embodiment of the present invention supports various data input/output modes. In this case, the amount of delay with respect to the internal clock ICLK_DQ is preferably the same as or larger than the amount of delay caused by the multiplexer 34. The reason for this is that the data mask input unit 16 does not require a multiplexer, and therefore the data mask signal can be inputted into the write driver prior to the data if the internal clock ICLK_DQ is delayed correspondingly with the amount of delay caused by the multiplexer 34.

Accordingly, the data mask signal is first inputted into the write driver via the second global input/output line, and then the data is inputted into the write driver via the first global input/output line.

In other words, the data mask input strobe signal is enabled prior to the data input strobe signal due to the difference in delay between the two internal clocks, and therefore the data mask signal always arrives at the write driver prior to the arrival of the data.

Therefore, the present invention provides an advantage, in that the present invention prevents data from being outputted from the write driver without masking, which is caused when the data beats the data mask signal to the write driver.

Additionally, the present invention includes an advantage in that poor data masking (which is caused by a race occurring between the data mask signal and the data) is prevented, since the present invention ensures that the data mask signal will be inputted into the write driver prior to the data.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device, comprising:
   a data mask input unit transferring a data mask signal;
   a data input unit transferring data, wherein the data input unit delays the transfer of data, such that the data outputted from the data input unit is delayed more than the data mask signal outputted from the data mask input unit; and
   a write driver selectively driving the delayed data outputted from the data input unit according to the data mask signal outputted from the data mask input unit, and outputting the data selectively driven as output data.

2. The semiconductor memory device as set forth in claim 1, wherein the data mask input unit outputs the data mask signal to the write driver synchronously with a first internal clock and the data input unit outputs the data to the write driver synchronously with a second internal clock delayed more than the first internal clock.

3. A semiconductor memory device, comprising:
   an internal clock generating unit generating a first internal clock and a second internal clock delayed more than the first internal clock;
   a data input unit aligning sequentially inputted data in parallel and outputting the aligned data to a first global input/output line synchronously with the second internal clock;
   a data mask input unit aligning sequentially inputted data mask signals in parallel and outputting the aligned data mask signals to a second global input/output line synchronously with the first internal clock; and
   a write driver selectively driving the data outputted to the first global input/output line according to the data mask signals outputted to the second global input/output line.

4. The semiconductor memory device as set forth in claim 3, wherein the internal clock generating unit comprises:
   a buffering unit buffering an external clock and outputting the buffered external clock as the first internal clock; and
   a delaying unit delaying the first internal clock and outputting the delayed first internal clock as the second internal clock.

5. A semiconductor memory device, comprising:
   an internal clock generating unit generating a first internal clock and a second internal clock delayed more than the first internal clock;
   a data input/output sense amplifying unit receiving data and the second internal clock and sensing and amplifying the data synchronously with the second internal clock to output the amplified data to a first global input/output line;
   a data mask input/output sense amplifying unit receiving a data mask signal and the first internal clock and sensing and amplifying the data mask signal synchronously with the first internal clock to output the amplified data mask signal to a second global input/output line; and
   a write driver selectively driving the data outputted to the first global input/output line according to the data mask signal outputted to the second global input/output line.

6. The semiconductor memory device as set forth in claim 5, wherein the internal clock generating unit comprises:
   a buffering unit buffering an external clock and outputting the buffered external clock as the first internal clock; and
   a delaying unit delaying the first internal clock and outputting the delayed first internal clock as the second internal clock.

7. A semiconductor memory device, comprising:
   an internal clock generating unit generating a first internal clock and a second internal clock delayed more than the first internal clock;
   a data strobe buffering unit buffering a data strobe signal to output the buffered data strobe signal as a data strobe rising pulse and a data strobe falling pulse;
   a data input unit receiving the first internal clock, the data strobe rising and falling pulses, and a write flag signal to control sequentially inputted data and outputting the controlled data to a first global input/output line;
   a data mask input unit receiving the second internal clock, the data strobe rising and falling pulses, and the write flag signal to control sequentially inputted data mask signals, and outputting the controlled data mask signals to a second global input/output line; and
   a write driver selectively driving the data outputted to the first global input/output line according to the data mask signals outputted to the second global input/output line.

8. The semiconductor memory device as set forth in claim 7, wherein the internal clock generating unit comprises:
- a buffering unit buffering an external clock and outputting the buffered external clock as the first internal clock; and
- a delaying unit delaying the first internal clock and outputting the delayed first internal clock as the second internal clock.

9. The semiconductor memory device as set forth in claim 7, wherein the data input unit comprises:
- a data buffering unit buffering the sequentially inputted data;
- a data latch/alignment unit receiving the data buffered in the data buffering unit and the data strobe rising and falling pulses, and latching and aligning the data in parallel synchronously with the data strobe rising and falling pulses;
- a data input strobe generating unit receiving the first internal clock and the write flag signal to generate a data input strobe pulse; and
- a data input/output sense amplifying unit sensing and amplifying the data latched and aligned in the data latch/alignment unit synchronously with the data input strobe pulse to output the amplified data to the first global input/output line.

10. The semiconductor memory device as set forth in claim 9, wherein the data input unit further comprises a multiplexer connected between the data latch/alignment unit and the data input/output sense amplifying unit, wherein the multiplexer selects paths through which the latched and aligned data is outputted to the data latch/alignment unit, wherein the paths are selected according to a data input/output mode.

11. The semiconductor memory device as set forth in claim 10, wherein the amount of delay that the internal clock generating unit delays the first internal clock is equal to or greater than the delay caused by the multiplexer to output the second internal clock.

12. The semiconductor memory device as set forth in claim 7, wherein the data mask input unit comprises:
- a data mask buffering unit buffering the sequentially inputted data mask signals;
- a data mask latch/alignment unit receiving the data mask signals buffered in the data mask buffering unit and the data strobe rising and falling pulses, and latching and aligning the data mask signals in parallel synchronously with the data strobe rising and falling pulses;
- a data mask input strobe generating unit receiving the second internal clock and the write flag signal to generate a data mask input strobe pulse; and
- a data mask input/output sense amplifying unit sensing and amplifying the data mask signals latched and aligned in the data latch/alignment unit synchronously with the data mask input strobe pulse to output the amplified data mask signals to the second global input/output line.

13. A method of data masking in a semiconductor memory device comprising the steps of:
- transferring a data mask signal inputted from outside the semiconductor memory device to an internal circuit;
- delaying data inputted from outside the semiconductor device more than the data mask signal and transferring the delayed data to the internal circuit;
- the delayed data transferred to the internal circuit with the data mask signal transferred to the internal circuit; and
- outputting the data selectively driven as output data.

14. The method of claim 13, wherein:
- when transferring the data mask signal, the data mask signal is transferred to the internal circuit synchronously with a first internal clock and,
- when delaying and transferring the data, the data is transferred to the internal circuit synchronously with a second internal clock delayed more than the first internal clock.

* * * * *